United States Patent [19]

Bethurum

[11] Patent Number: 5,563,770

[45] Date of Patent: Oct. 8, 1996

[54] IC CARD WITH BOARD POSITIONING MEANS

[75] Inventor: Gary C. Bethurum, Laguna Niguel, Calif.

[73] Assignee: ITT Corporation, New York, N.Y.

[21] Appl. No.: 528,341

[22] Filed: Sep. 14, 1995

Related U.S. Application Data

[63] Continuation-in-part of Ser. No. 201,983, Feb. 25, 1994, Pat. No. 5,477,426.

[51] Int. Cl.$^6$ ...................................................... H05K 1/14
[52] U.S. Cl. ........................... 361/737; 361/758; 361/816; 439/76.1; 257/679
[58] Field of Search ................................. 361/737, 752, 361/753, 758, 796, 800, 816, 817, 818; 439/76, 282; 235/492, 380; 257/659, 679, 660; 364/708

[56] References Cited

U.S. PATENT DOCUMENTS

| | | |
|---|---|---|
| 5,124,888 | 6/1992 | Suzuki . |
| 5,242,310 | 9/1993 | Leung ........................................ 439/76 |
| 5,481,434 | 1/1996 | Banakis et al. ........................... 361/756 |

Primary Examiner—Leo P. Picard
Assistant Examiner—Y. Whang
Attorney, Agent, or Firm—Thomas L. Peterson

[57] ABSTRACT

An IC card is provided which can be constructed at low cost and which allows adjustment of circuit board position. The circuit board (30, FIG. 2) has forward and rearward end portions (34, 36) which are mounted directly on forward and rearward connectors (12, 14), without a separate frame to mechanically hold them together. A cover (60) with upper and lower parts (66, 68), is mechanically mounted to the connectors and is coupled to the circuit board only in an electrical ground. Each connector is mounted to a circuit board end by pegs (90, 92) that lie on laterally opposite sides of the row of connector contacts (46), with each peg being received in a hole (100, 102) of the circuit board. The pegs can be separate parts (270, FIG. 12) that project through holes (254) in the board and into holes (250) in the connector, and washers (262) can lie between the board and each connector at locations adjacent to the pegs.

25 Claims, 5 Drawing Sheets

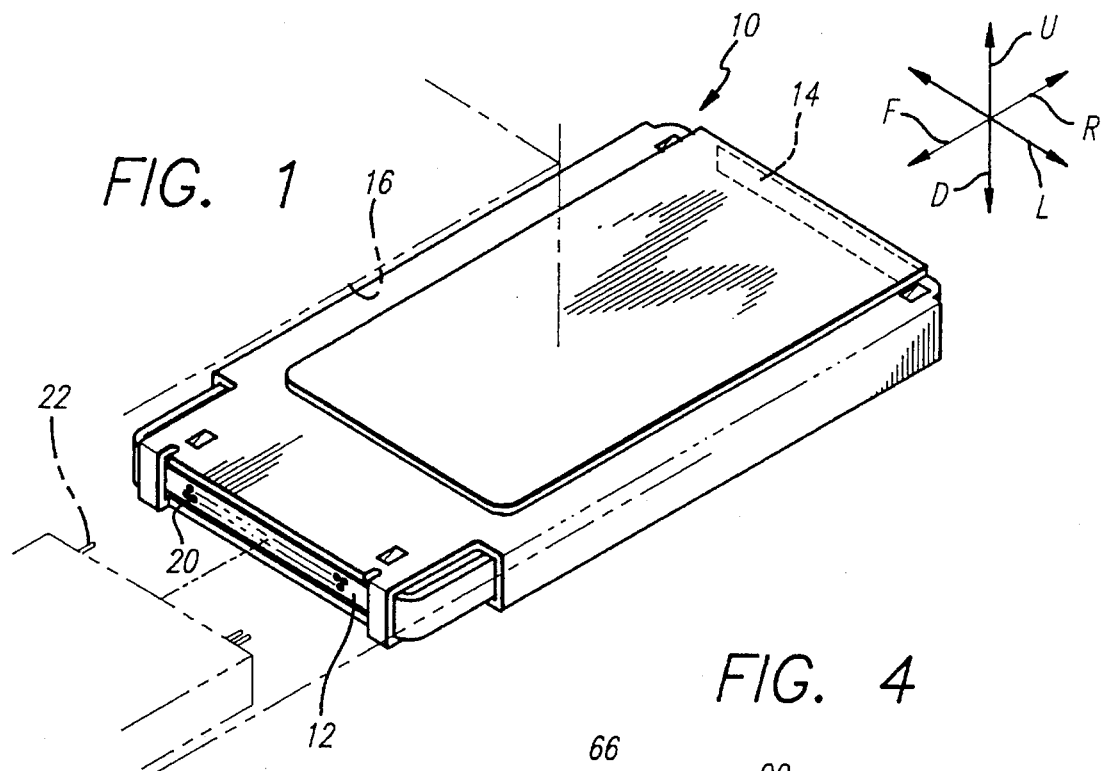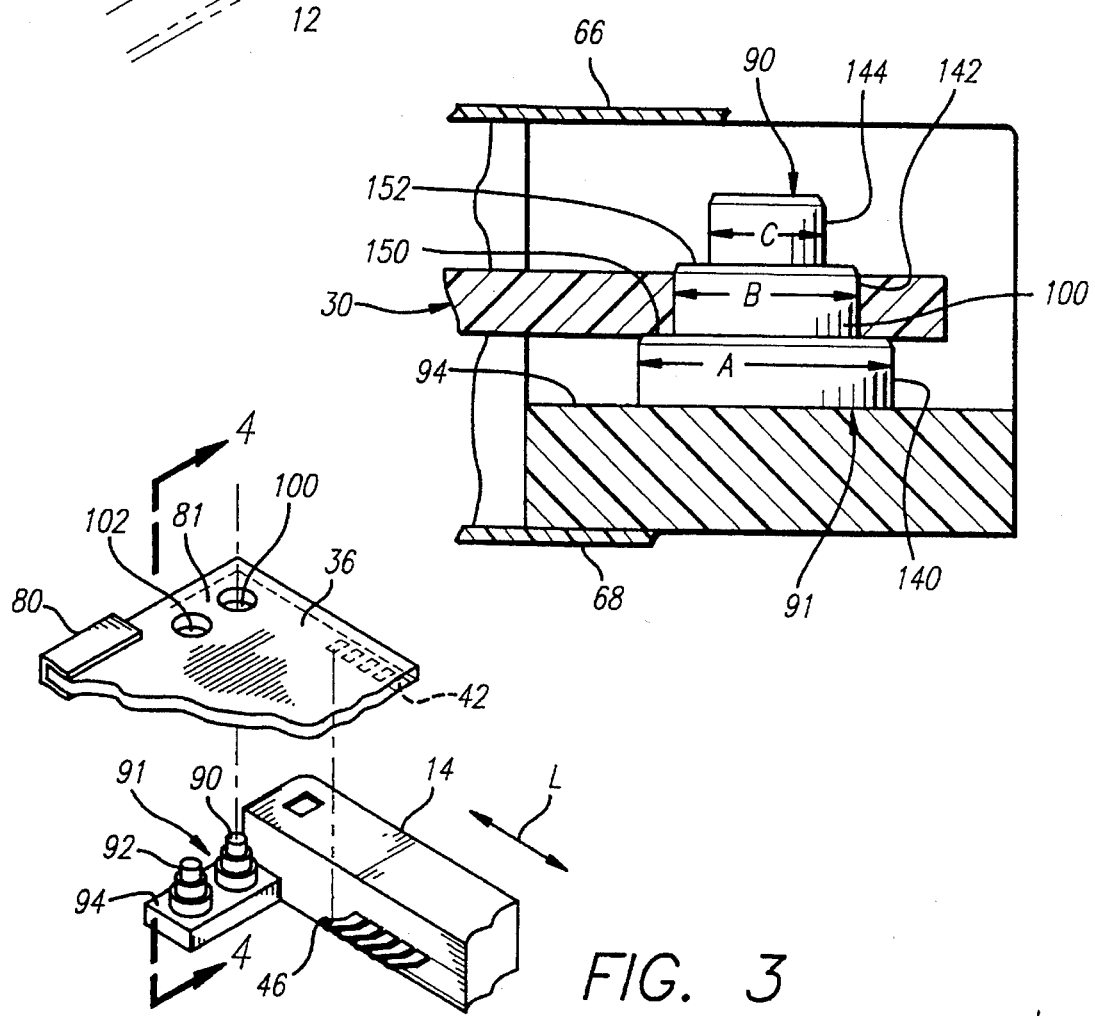

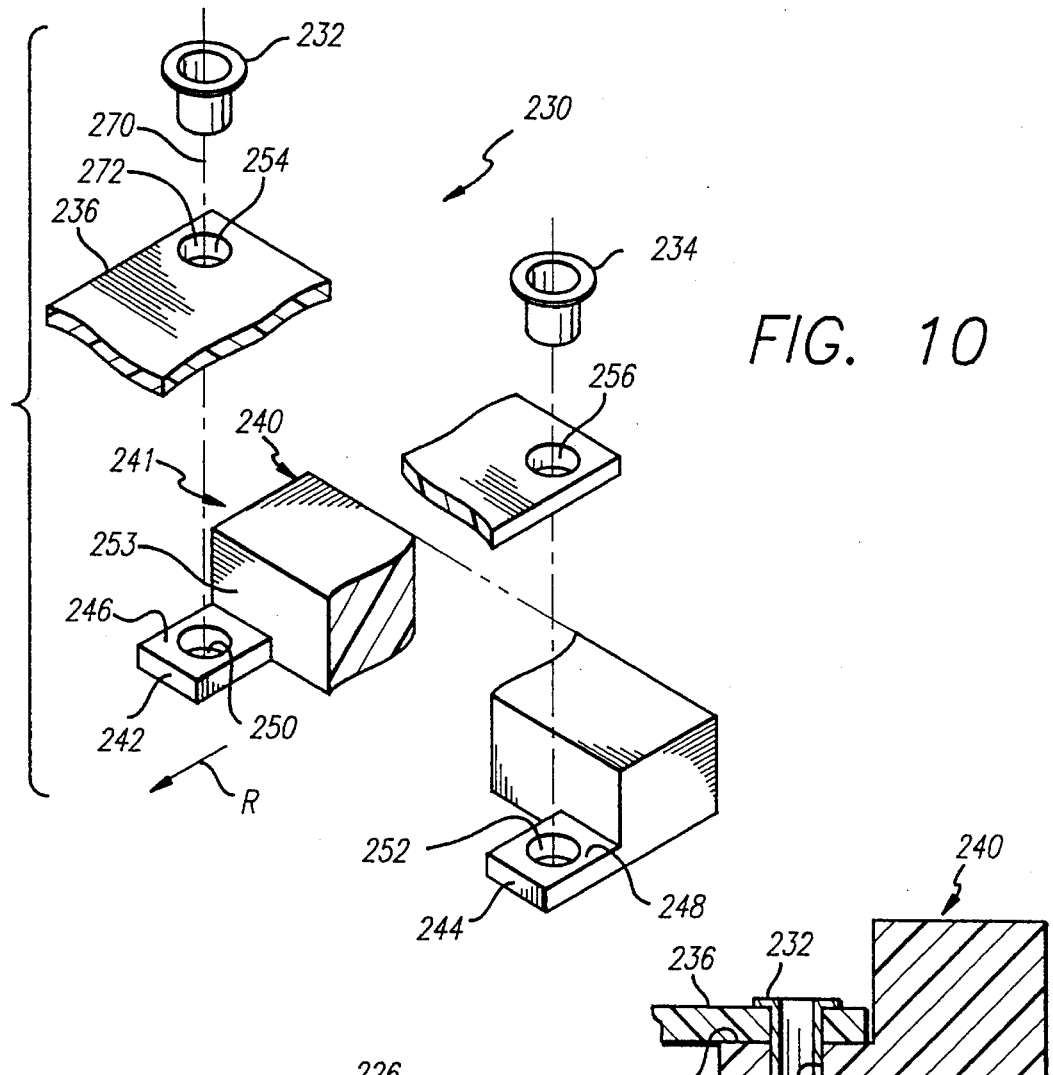
FIG. 10
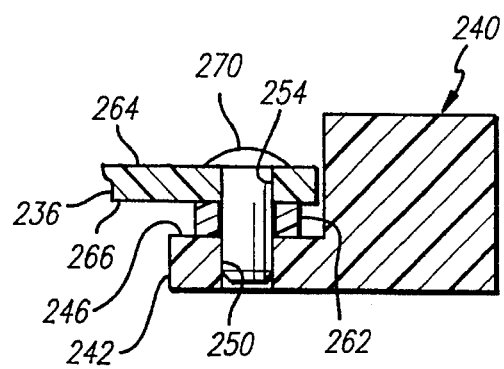
FIG. 11
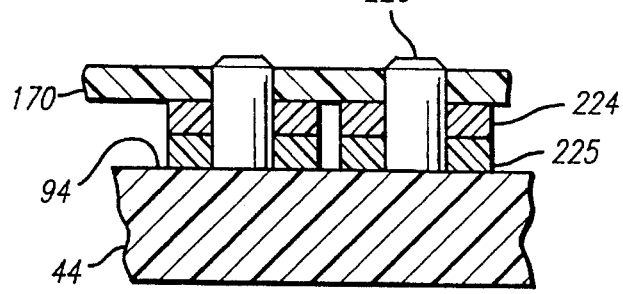
FIG. 8A
FIG. 12

IC CARD WITH BOARD POSITIONING MEANS

CROSS REFERENCE

This is a continuation-in-part of U.S. application Ser. No. 08/201,983 filed Feb. 25, 1994, now U.S. Pat. No. 5,477,426.

BACKGROUND OF THE INVENTION

IC cards, which are often memory cards, are commonly constructed with a molded plastic frame. Front and rear connectors are mounted and/or molded into the frame, and top and bottom covers are mounted on the frame. U.S. Pat. Nos. 5,207,586 and 5,244,397 show IC cards of this construction. If the number of parts to be constructed and assembled were reduced, the IC cards could be constructed at lower cost.

Under JEIDA standards, each IC card has a card length of 3.370 inch, a card width of 2.126 inch, and a card thickness of 0.190 inch. Accordingly, there is very little vertical space between top and bottom surfaces of the circuit boards and the top or bottom cover portions of the card. If the vertical height of the circuit board could be changed, a designer could leave about equal spaces at both surfaces of the circuit board to place a maximum number of thin components on both board surfaces. Alternatively, the designer could maximize the space on one board surface to accommodate thicker components on that surface, at the expense of eliminating moderately thick components on the other surface. If such choice could be made by the circuit board manufacturer who assembles the IC card, with the other components unchanged from a "standard" design, this would increase design choices for the circuit board manufacturer.

SUMMARY OF THE INVENTION

In accordance with one embodiment of the present invention, an IC card is provided that is of low cost and which allows adjustment of circuit board height. The IC card includes a circuit board with its forward and rearward end portions respectively mounted on forward and rearward connectors, without requiring an intermediate frame. The cover is also mounted on the front and rear connectors and is connected to the circuit board substantially only by an electrical ground connection.

Each connector has a laterally-extending row of contacts that engage corresponding contact pads on an end portion of the circuit board. Pegs lying laterally beyond opposite ends of the row of contacts connect the circuit board to the connector. Each circuit board end portion has holes at its opposite sides which receive corresponding pegs. The pegs can be integrally molded in a connector housing, or the pegs can be separate parts mounted in holes in the connector housing.

Each peg can have at least two steps. Board-supporting surface regions of different heights lie at the bottoms of the steps, to support a circuit board at a selected height, while the pegs horizontally locate the board. An alternative is to provide a washer of selected thickness between the circuit board and a connector, at each peg.

The novel features of the invention are set forth with particularity in the appended claims. The invention will be best understood from the following description when read in conjunction with the accompanying drawings.

BRIEF DESCRIPTION OF THE DRAWINGS

FIG. 1 is an isometric view of an IC card of the present invention, and showing, in phantom lines, a portion of an electronic device that receives the card.

FIG. 3 is a partial exploded view of a connector and of a circuit board end portion that can mount thereon.

FIG. 4 is a partial sectional view taken on line 4—4 of FIG. 3, showing the parts in an assembled position.

FIG. 8A is a partial sectional view of a connector and circuit board of another embodiment of the invention, with spacer washers.

FIG. 10 is a partial exploded isometric view of an IC card constructed in accordance with another embodiment of the invention.

FIG. 11 is a partial sectional view of the IC card of FIG. 10.

FIG. 12 is a partial sectional view of the IC card of FIG. 11, but with a spacer washer and a plastic peg.

DESCRIPTION OF THE PREFERRED EMBODIMENTS

Figure 2:
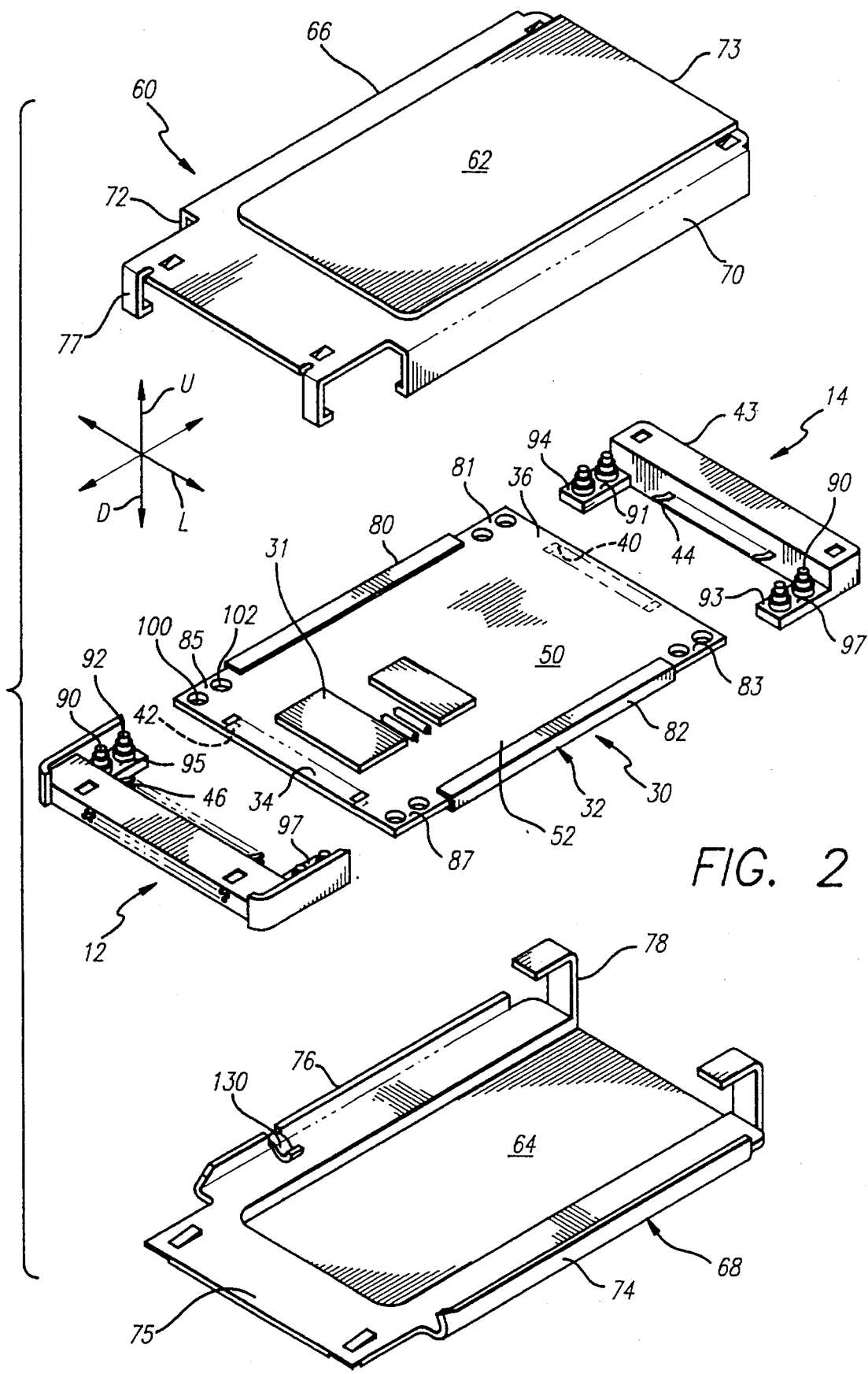
FIG. 2 is an exploded isometric view of the IC card of FIG. 1.

FIG. 1 illustrates an IC card 10 which has connectors 12, 14 at its opposite ends. The connectors 12, 14 can be designated respectively as front and rear connectors, although the opposite could be done. The card is designed to be inserted in a forward direction F into an electronic device 16, until contacts 20 on the front connector engage corresponding contacts 22 of the electronic device. The card is withdrawn in a rearward direction R. IC cards have standard maximum dimensions under PCMCIA standards, in upward and downward directions U, D, lateral directions L and longitudinal directions F, R. The IC card should be constructed at low cost while providing maximum utilization of the limited space within the card to hold electronic components.

FIG. 2 shows that the IC card includes a circuit board assembly 30 with electronic components 31 such as integrated circuits, resistors, capacitors, etc., which are mounted on a circuit board 32. The circuit board has laterally opposite side 80, 82 and forward and rearward end portions 34, 36, and has laterally-extending rows of contact pads 40, 42 at its opposite end portions. The front and rear connectors 12, 14 each include a block 43 of molded plastic forming a connector housing, and at least one laterally extending row of contacts with contact tails 44, 46. The contact tails are constructed to engage corresponding rows of contact pads 40, 42 on the circuit board. It is noted that the circuit board has upper and lower surfaces 50, 52, and the contact pads are normally located on the lower surface 52.

A cover 60 is designed to surround the circuit board assembly. The cover includes upper and lower cover parts 66, 68 that have sheet-like portions 62, 64 that lie respectively above and below a majority of the surface area of the circuit board. The upper cover part includes a pair of upper side flanges 70, 72, which engage corresponding lower side flanges 74, 76 on the lower cover part. The parts are assembled by first mounting the circuit board opposite end portions on the connector 12, 14. This subassembly is placed in the lower cover part 68. The rear 73 of the upper cover part is placed at the front 75 of the lower one, and the upper cover part is slid in the rearward direction R. U-shaped fingers 77, 78 at the front and rear of corresponding cover parts help to keep the fully assembled cover parts in place on the connectors.

Previous PCMCIA IC cards have used a molded plastic frame which held the other parts together. U.S. Pat. Nos. 5,207,586 and 5,244,397 show IC cards of this type, wherein the molded plastic frame extended between the front and rear connectors and held them rigidly in place, supported the circuit board assembly, and supported top and bottom cover parts. Although in previous and present IC cards there is some mechanical connection between the circuit board and the connectors through the soldering connection of the rows of contact tails or contacts 44, 46 with the conductive pads 40, 42 on the circuit board, such solder connections usually cannot be relied upon for strong mechanical coupling, which was previously achieved by the molded plastic frame.

In accordance with one aspect of the present invention, applicant provides a frameless IC card wherein the opposite end portions 34, 36 of the circuit board, mount directly on the front and rear connectors 12, 14. The rear end portion 36 of the board has board mount parts 81, 83 at its opposite sides, that mount on the rear connector 14, and the front end portion 34 of the board has board mount parts 85, 87 that mount on the front connector 12. The connectors have corresponding support parts 91, 93, 95 and 97, with all mount parts being similar and all support parts being similar. As shown in FIG. 3, each circuit board mount part such as 81, extends laterally beyond a corresponding row of contact pads 42 (e.g. laterally beyond an end of the row). Each board mount part such as 81 of the circuit board end portion is directly mounted on a corresponding connector support part such as 91 which extends laterally beyond a corresponding row of contacts 46. Each support part such as 91, includes first and second platforms or pegs 90, 92 that extend up from a first board-supporting surface 94. The side 80 of the circuit board which forms the mount part 81, has a pair of holes 100, 102 that are designed to closely receive the corresponding pegs 90, 92. Thus, the front and rear connectors form an apparatus for holding the circuit board. Each of the pegs has several steps, which will be discussed below.

Figure 6:
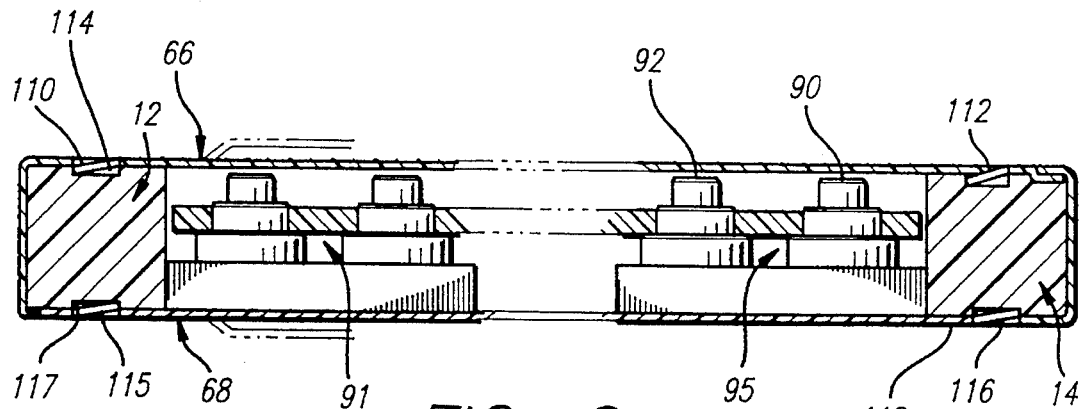
FIG. 6 is a partial sectional view of the IC card of FIG. 1.
Figure 7:
FIG. 7 is a partial sectional view of the IC card of FIG. 1.

With the front and rear portions of the circuit board securely mounted on the front and rear connectors, the cover can be placed around the circuit board and connectors. FIG. 6 shows the manner in which the upper and lower cover parts 66, 68 are mounted on the front and rear connectors 12, 14. The upper cover part 66 has downwardly-inclined tabs 110, 112 which project into corresponding recesses 114 at the tops of the connectors. The lower cover part has tabs 115, 116 that project into corresponding recesses 117 at the bottoms of the connectors. The tabs form connect parts that mount the cover ends to the connectors, to thereby attach the cover parts to the connectors. Cover parts such as 118 lying against the connectors also form connect parts. Adhesive also can be used to hold the cover parts to the connectors. The cover parts also have interfitting side flange parts (FIG. 7). It is noted that the covers are directly mounted on the front and rear connectors, as is the circuit board 30. No intermediate frame apart from the cover parts and circuit board, extends between the connectors. It is noted that there is a grounding electrical connection between the cover and a ground plane of the circuit board. FIG. 7 shows that the lower cover part 68 has a tab 130 which engages a location on a ground plane 132. However, this does not provide a rigid connection or mechanical support, and there is substantially no other direct connection between the circuit board and cover.

FIGS. 3 and 4 show that each platform or peg 90, 92 has a plurality of peg parts or steps 140, 142, and 144. The first step 140 is of greatest width A, while the second and third steps 142, 144 have progressively smaller widths B and C. The support part 91 forms board-supporting surfaces or surface regions 94, 150, 152 at the bottom of each step. The holes such as 100 in the circuit board 30, are shown in FIG. 4 as having a hole width B so the walls of the circuit board holes are closely received in the second steps 42, and the lower surface of the circuit board rests on the second board-supporting surface region 150.

The connectors 12, 14 (FIG. 2) and cover 60 are usually made by a manufacturer who makes large volumes of such connectors and covers. The connector and cover manufacturer commonly sells such parts to a firm that designs and constructs a circuit board with its own circuitry thereon, and assembles the circuit board to the connectors and cover to form a complete IC card. The circuit board manufacturer usually has drills that can form the holes such as 100, 102 so the holes are of a closely controlled width or diameter, and in a pattern wherein the holes are precisely located. The circuit board manufacturer can choose the particular height of the circuit board by choosing the diameter of the circuit board holes that he drills. A particular height of the circuit board above the first surface 94, is chosen so that the desired circuit components can be mounted on the circuit board. If an engineer who designs the circuit board requires components of large vertical thickness, he may drill small holes so that the circuit board rests on the third platform 152 (FIG. 4). This will leave a relatively thick space below the bottom of the circuit board, on which the thick component can be mounted. However, it will leave little room for mounting components on the upper surface of the circuit board. On the other hand, if the engineer wishes to cram a large number of circuit components of moderately small thickness onto the board, he can use large diameter holes so the circuit board rests on the first surface region 90. This will leave thick spaces both above and below the circuit board, between the board and the covers 66, 68.

Figure 5:
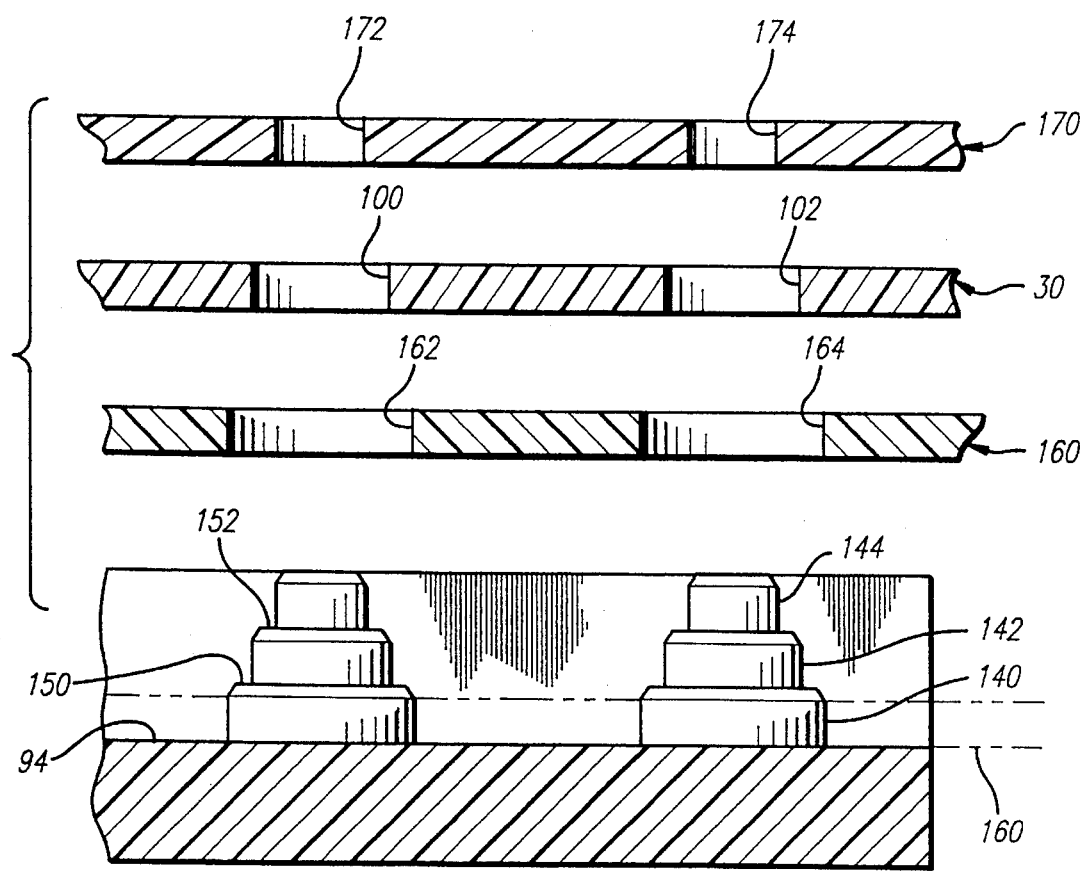
FIG. 5 is a partial sectional view of the connector and circuit board of FIG. 4, and also showing two other circuit boards which can be used.

FIG. 5 shows another circuit board 160, that is similar to the circuit board 30, but wherein the circuit board 160 has holes 162, 164 to enable it to be received by the lowermost step or peg part 140. The figure also shows still another circuit board 170 with smaller holes 172, 174 that enable it to be closely received by the third pegs or steps 144.

Figure 8:
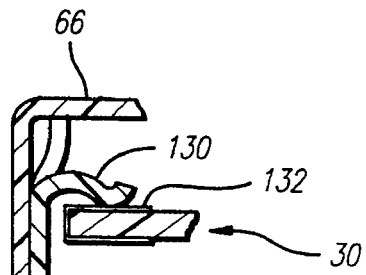
FIG. 8 is a partial isometric view of a peg constructed in accordance with another embodiment of the invention.

A variety of approaches can be used to securely fasten the circuit board in place after its holes have received the pegs. One method is to use simple press fitting. Another method is to use adhesive which will adhere the lower surface and the walls of its holes to the peg and/or the lowermost surface 94. FIG. 8 shows modified pegs 90A with slots 150 that permit the pegs to be compressed when a circuit board is pressed firmly in place. In FIG. 8, the peg 90A is manufactured separately from the connector 12A, with the peg having a post 152 press fitted into a hole in the connector.

Figure 9:
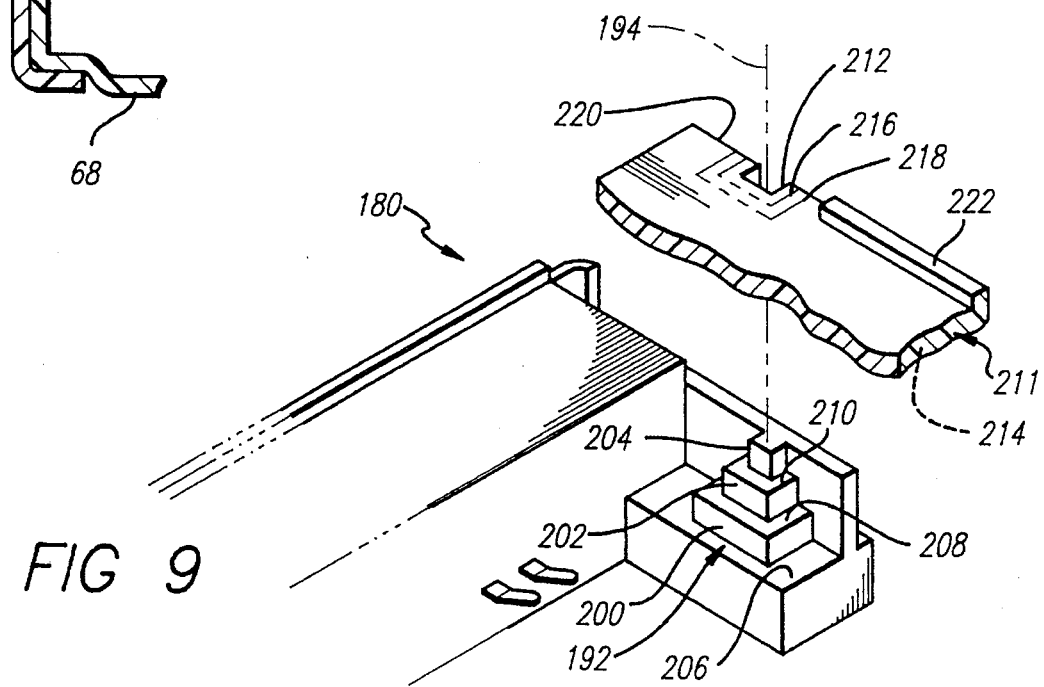
FIG. 9 is a partial exploded view of a peg and circuit board constructed in accordance with another embodiment of the invention.

FIG. 9 illustrates part of an assembly 180 of another embodiment of the invention, wherein each peg or platform is of rectangular shape as seen in a plan view taken along vertical line 194. A particular peg or platform 192 has three steps 200, 202, 204 and three corresponding board-supporting surfaces 206, 208, and 210. The circuit board 211 has a hole 212 designed to receive one of the steps, with the particular hole 212 shown in solid lines being designed to receive the uppermost step 204, so the lower surface 214 of the circuit board lies on the board-supporting surface 210. FIG. 9 shows two other hole sizes 216, 218 of different widths to enable the circuit board to lie at progressively lower heights. The holes such as 212 are in the form of slots that extend to the extreme side edge 220 of the circuit board and can be larger than those illustrated. While such slots are not as easy to form as round holes, they can be formed by saws that cut into the edge of the circuit board. FIG. 9 also shows that the circuit board 211 has a ridge or integral beam portion 222 that increases the longitudinal rigidity of the circuit board.

Instead of using stepped pegs, long pegs can be used which are of uniform diameter, with washers to select the spacing of the circuit board from a connector surface. FIG. 8A shows an example of this, where washers 224, 225 space the circuit board 170 from a connector 44. The washers surround long pegs 226. The circuit board lies substantially against the connector board-supporting surface 94, since the washers act as thicker parts of the circuit board that take only compressive force rather than any bending forces.

FIGS. 10–12 illustrate an assembly 230 of another embodiment of the invention, wherein pegs 232, 234 project through holes in a circuit board 236 and into holes in a connector block housing 240 of a connector 241. The particular pegs shown are formed from sheet metal. The connector housing has board support parts 242, 244 forming board-supporting surfaces 246, 248 with peg-receiving holes 250, 252 therein. It can be seen that the support parts 242, 244 are thinner than a main part 253 of the connector block housing and extend rearwardly (R) therefrom (in the case of a front connector). The circuit board has holes 254, 256 that are aligned with the connector holes. The holes lie on laterally opposite sides of a row of contacts (such as 46 in FIG. 3).

The assembly 230 can be constructed by drilling the board holes 254, 256 so they can be aligned with the connector holes 250, 252, and placing the circuit board over the connector support parts with the holes in alignment. Then the pegs are inserted and pushed down through the board and connector holes. Alternatively, the pegs can be first installed in the circuit board holes, and then pushed down with the circuit board, against the connector board-supporting surfaces. The pegs are retained in the connector holes by an interference fit therein, and/or by barbs formed in the pegs, adhesive, staking, etc. It is possible to project slightly longer pegs upwardly through the connector holes and through the circuit board holes, and with the upper ends of the pegs staked, as by rolling over the upper ends of sheet metal pegs or heat-deforming the upper ends of plastic pegs.

FIG. 12 shows an arrangement 260 similar to that of FIGS. 11–12 except that a spacer washer 262 is used to raise the level of the faces 264, 266 of the circuit board 236. Also, a longer peg 270 is used, with a plastic peg being shown which lies in interference fit with the connector hole 250. The washer preferably has a hole for receiving the peg, with parts of the washer lying on opposite sides of the peg. The washer is held tightly between the circuit board 236 and board support part 242, by being slightly compressed between them. The circuit board 236 is mounted substantially against the connector board-supporting surface 246, in that the washer 262 acts like a thickened part of the circuit board. It is possible to provide separate pegs with steps in them (e.g. as shown at 90 in FIG. 3).

The use of pegs to position the circuit board on the connectors, has the advantage that the pegs can accurately locate the contact tails 46 (FIG. 3) against the circuit board traces 42 to which the tails are soldered. A common IC card design has sixty-eight contacts at the front connector, with a lateral spacing of contact tails of about 0.63 mm (0.025 inch). The contact tails must be positioned within 0.25 mm (0.010 inch) of the ideal position, and preferably within about 0.1 mm (0.005 inch). Such positioning can be readily accomplished by having the pegs fit within the circuit board holes with a clearance of no more than 0.1 mm (0.005 inch). It can be seen that each hole (e.g. 254 in FIG. 10) has an axis 270 and is of cylindrical shape. Each hole has hole walls that extend 360° around the hole axis.

Although terms such as "vertical", "horizontal", "upper and lower", etc, have been used herein to describe the parts of the IC card as shown in the figures, it should be understood that the IC card and its parts can be assembled and used in any orientation with respect to gravity.

In the arrangements illustrated, each end portion of the circuit board is rigidly connected to a corresponding connector at locations laterally beyond the row of connector contacts. It is possible for the circuit board to extend rearwardly and forwardly slightly further and to mount to connector locations that lie above the row of contacts. However, such mounting is more difficult because it requires the portions of the connector that hold the front contact portions to be thinner. In the case of the front connector which typically has two vertically spaced rows of contacts (but with the tails usually lying in one row), there is very little room for such mounting. By mounting the circuit board on laterally opposite sides of each connector, applicant uses connector portions that may not be otherwise utilized and which can be easily made to be thinner than the contact-holding portions. In some cards, no contacts are required at the rear of the card, in which case the rear connector can be formed by a block of molded plastic without contacts.

Thus, the invention provides an IC card which is of simplified construction and which simplifies selection of circuit board height with respect to the connectors. The IC card is frameless, in that opposite end portions of the circuit board are directly and rigidly (except for any washer resilience) connected to front and rear connectors. The cover can include upper and lower cover parts that are also directly mounted on the connector, or a one-piece cover can be used. All of this is preferably accomplished without the use of a separate frame that would extend between the front and rear connectors and which would support the circuit board and cover parts. The connection of each circuit board end portion to a connector is preferably accomplished at locations laterally beyond the row or rows of contacts of the connector, so that attachment occurs in connector regions of moderately small vertical thickness. Such connections can be accomplished by providing pegs on the connectors, which are received in holes formed in the circuit board. The pegs can be mounted on the connectors by molding the pegs integrally with the connector housing, or by providing holes in the connector housing that receive separate pegs. Washers can be placed between a board-supporting surface of a connector housing and a circuit board location. An alternative is the use of pegs with steps.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. An IC card which includes a circuit board assembly having a circuit board with circuit components thereon, said circuit board having forward and rearward end portions, opposite sides, and upper and lower surfaces, with said forward end portion having a row of contact pads, said IC card including front and rear connectors with at least said front connector having contacts engaged with said contact pads, and said IC card also including a cover that has upper and lower portions that lie respectively above and below a majority of said circuit board, characterized by:

said front and rear connectors each have support parts with board-supporting surfaces;

said circuit board end portions each have peg-receiving board holes and have board surface portions spaced from said row of contact pads and supported over said board-supporting surfaces;

a plurality of pegs, each peg projecting through one of said board holes and connected to one of said connectors at a connector location that lies adjacent to one of said board-supporting surfaces;

a plurality of spacer washers, each lying tightly between one of said board surface portions and one of said connector board supporting surfaces.

2. An IC card which includes a circuit board assembly having a circuit board with circuit components thereon, said circuit board having forward and rearward end portions, opposite sides, and upper and lower surfaces, with said forward end portion having a row of contact pads, said IC card including front and rear connectors with at least said front connector having contacts engaged with said contact pads, and said IC card also including a cover that has upper and lower portions that lie respectively above and below a majority of said circuit board, characterized by:

said front and rear connectors each have support parts with board-supporting surfaces;

said circuit board end portions each have peg-receiving board holes and have board surface portions spaced from said row of contact pads and supported over said board-supporting surfaces;

a plurality of pegs, each peg projecting through one of said board holes and connected to one of said connectors at a connector location that lies adjacent to one of said board-supporting surfaces;

said contacts of said front connector have a laterally-extending row of tails and said row of contact pads extends in a lateral direction, with each tail positioned on one of said contact pads;

said board holes each have a hole axis and said board holes are each of cylindrical shape and have hole walls that extend 360° around the corresponding hole axis;

said pegs are closely received in said board holes with a clearance of no more than 0.005 inch, and the lateral positions of said contact tails with respect to said contact pads is fixed by said pegs in said board holes.

3. An IC card subassembly which includes front and rear connectors and a circuit board assembly that includes a circuit board and components on the circuit board, wherein the circuit board has front and rear end portions mounted respectively on said front and rear connectors, and wherein said circuit board has a row of conductive pads at at least said front end portion, wherein:

said circuit board front end portion has a plurality of holes;

said front connector has a row of contacts engaging said row of conductive pads on said circuit board front end portion;

said front connector has at least one board-supporting surface and a plurality of holes therein; and including a plurality of pegs, each peg depending from said circuit board and projecting into a connector hole.

4. The subassembly described in claim 3 wherein:

at least one washer lying between said circuit board and said front connector at a location beside each of said pegs.

5. Connector apparatus for use in an IC card to hold a circuit board assembly that includes a circuit board and components on the circuit board, wherein the circuit board has front and rear end portions, and has a row of conductive pads at each of said end portions, comprising:

front and rear connectors that each have a row of contacts for engaging a corresponding one of said rows of conductive pads;

each of said connectors having a plurality of board support surface areas that are spaced from said contacts, with each support surface area having a peg-receiving hole for receiving a peg to hold said circuit board against the support surface area.

6. The apparatus described in claim 5 wherein:

said row of contacts of each of said connectors extends in a lateral direction, and said plurality of support surface areas lie beyond laterally opposite ends of the corresponding row of contacts.

7. The apparatus described in claim 5 including said circuit board and a plurality of pegs and wherein:

said circuit board front and rear end portions are mounted respectively on said front and rear connectors, with each of said circuit board end portions having a plurality of holes aligned with said holes in said connector support surfaces, with each circuit board end portion having lower board surface portions lying over said board-supporting surface areas, and with said pegs each projecting through a hole in said circuit board and into a hole in said connector support surface areas.

8. The apparatus described in claim 7 including:

a plurality of spacer washers each lying between one of said board-supporting surface areas and one of said lower board surface portions and being tightly sandwiched therebetween, with each of said washers having a washer hole and with one of said pegs projecting through each washer hole.

9. A connector for use in an IC card that has opposite ends with said connector lying at a first of said ends, wherein said IC card includes a circuit board and a cover that substantially surrounds said circuit board, wherein said connector has a small vertical height and has a laterally extending dimension that is a plurality of times greater than said height, and said connector includes at least one laterally extending row of contacts having contact tails for engaging contact pads of the circuit board, characterized by:

said connector has a thick main part and has a pair of thinner board support parts extending from said main part toward said second end, said connector including a plurality of vertically extending pegs mounted on said board support parts and projecting upwardly therefrom for projecting into holes of a circuit board to locate the board, and said board support parts each has a board supporting surface lying adjacent to each peg to support a region of the circuit board surface lying adjacent to the board hole.

10. A connector for use in an IC card that includes a circuit board and an electrically conductive cover that substantially surrounds said circuit board, wherein said connector has a small vertical height and has a laterally extending dimension that is a plurality of times greater than said height, characterized by:

a plurality of pegs extending upwardly from said connector for projecting into holes of a circuit board to locate the board;

each of said pegs has a plurality of vertically stacked peg parts, with progressively higher peg parts being of progressively smaller horizontal width.

11. The front connector described in claim 10 wherein:

each of said peg parts is of substantially circular shape as seen in a plan view, to closely receive a round hole that has been drilled into a circuit board.

12. The connector described in claim 10 including said circuit board, and wherein:

said circuit board has first and second end portions and a row of contact pads at said second end portion, and said circuit board end portions each have peg-receiving holes; and including a second connector which has a laterally extending dimension and at least one laterally extending row of contacts with contact tails;

a plurality of vertically extending peg elements lying on laterally opposite sides of said row of contacts and extending upwardly from said second connector, for projecting into holes of said circuit board to locate the second end portion of the circuit board, and said second connector has a board supporting surface lying adjacent to each peg element to support a circuit board surface region lying adjacent to one of the board holes.

13. A method for constructing an IC card, which includes forming front and rear connectors each with a laterally extending row of contacts that each has a contact tail, forming a circuit board with a laterally extending row of contact pads on its forward and rearward end portions, forming a cover, and assembling said connectors, circuit board, and cover into an IC card, characterized by:

and step of forming said connectors includes forming each of said connectors with connector holes on laterally opposite sides of said row of contacts;

said step of forming said circuit board includes forming board holes in said front and rear end portions laterally beyond said rows of contact pads, and including placing said circuit board end portions substantially against said connectors and projecting pegs at least partially through said board holes and said connector holes to precisely position each contact tail against only one contact pad.

14. The method described in claim 13 including:

projecting said pegs through said board holes before placing said circuit board end portions substantially against said connector, and including placing spacer washers between said circuit board end portions and said connectors and sandwiching said washers therebetween while driving said pegs into said connector holes.

15. A frameless IC card comprising:

a circuit board assembly having a circuit board with circuit components thereon, said circuit board having forward and rearward end portions, with said forward end portion having a row of contact pads thereon;

front and rear connectors with at least said front connector having contacts engaged with said contact pads;

said connectors each having a support surface thereon;

said circuit board front end portion being mounted substantially directly on the support surface of said front connector, and said circuit board rear end portion being mounted substantially directly on the support surface of said rear connector;

an electrically conductive cover having upper and lower portions that lie respectively above and below a majority of said circuit board;

said IC card being devoid of a frame extending between said front and rear connectors, with said circuit board being supported on said connectors solely by direct connections thereto at the front and rear ends of the board.

16. The IC card described in claim 15 wherein:

said circuit board has an electrically conductive ground trace;

said cover has forward and rearward ends attached directly respectively to said front and rear connectors, said cover being free of direct connection to said circuit board, except that said cover has at least one resiliently bendable sheet metal tab engaged with said ground trace.

17. The IC card described in claim 15 wherein:

said connectors each have a tab-receiving recess;

said cover has forward and rearward end portions and has at least one retention tab adjacent to each of said cover end portion, said tabs extending into corresponding recesses in said connectors.

18. The IC card described in claim 15 wherein:

said front and rear connectors are each largely in the form of molded rigid plastic blocks that form said support surfaces, and each of said connectors has a laterally extending row of contacts, including said contacts of said front connector;

said circuit board end portions are each mounted on a corresponding one of said connectors;

said circuit board has a middle portion lying between said board forward and rearward end portions, said middle portion being free of rigid support.

19. A frameless IC card comprising:

front and rear connectors that each have a laterally extending width dimension;

a circuit board assembly that includes a circuit board and at least one circuit component mounted on said board, said circuit board having front and rear end portions and having a middle portion extending between said end portions;

an electrically conductive cover having upper and lower sheet-like portions lying respectively above and below said circuit board assembly, said cover including front and rear end portions that are mounted respectively on said front and rear connectors;

said circuit board front end portion being connected directly to said front connector and said circuit board rear end portion being connected directly to said rear connector;

said IC card being devoid of any intermediate nonconductive frame spanning the distance between said connectors, and said circuit board middle portion being free of rigid support, with said circuit board forming a beam that supports and positions said front and rear connectors with respect to each other.

20. The frameless IC card described in claim 19 wherein:

said front and rear connectors each have a laterally extending row of contacts, and said circuit board has a laterally extending row of contact pads engaged with said contacts;

said circuit board end portions are each fixed to a corresponding connector at locations that are laterally spaced from the corresponding row of contacts.

21. A method for constructing an IC card, which includes forming front and rear connectors each with a laterally extending row of contacts, forming a circuit board with forward and rearward end portions and a middle portion between said end portions, and with a laterally extending row of contact pads on its forward and rearward end portions, forming a cover, and assembling said connectors, circuit board, and cover into an IC card, characterized by:

and step of forming said connectors includes forming each of said connectors with support surfaces that are laterally spaced from its row of contacts;

said step of assembling includes supporting said circuit board end portions on said support surfaces of said connectors, while leaving said board middle portion free of support.

22. The method described in claim 21 including:

mounting said cover substantially only on said front and rear connectors.

23. A combination of components which when assembled form a frameless IC card housing for holding a circuit board assembly that includes a circuit board and components on the circuit board, wherein the circuit board has front and rear board end portions, with at least said front board end portion having a row of conductive pads, said combination comprising:

front and rear connectors, with at least said front connector having a row of contacts for engaging said row of conductive pads;

each of said connectors has a support surface thereon, said support surfaces being adapted to directly support said front and rear board end portions, respectively, of said circuit board; and a cover for substantially enclosing said circuit board, said cover having forward and rearward cover end portions, each of said cover end portions having parts for attaching said cover to a corresponding one of said connectors;

said front connector having a thick main part and a pair of thinner board support parts extending rearwardly from said main part and forming said support surfaces, and including a plurality of vertically extending pegs mounted on said board support parts and projecting upwardly therefrom for projecting into holes of a circuit board to locate the board.

24. The combination described in claim 23 wherein:

each of said pegs has a plurality of vertically stacked peg parts, with progressively higher peg parts being of progressively smaller horizontal width.

25. An IC card comprising:

a sheet metal lower shield half having a lower sheet with opposite sides and longitudinally spaced front and rear ends, said lower shield half having upstanding side rails at said sides wherein each rail extends longitudinally along the corresponding side;

a circuit board-and-connector assembly including front and rear connectors lying respectively at front and rear ends of said lower sheet and a circuit board extending between said connectors;

a sheet metal upper shield half having an upper sheet lying over said assembly and said lower sheet, with said upper sheet having opposite sides and with said upper shield half having depending upper rails at said opposite sides thereof, wherein each of said upper rails extends longitudinally along the corresponding upper sheet side, said upper rails lying outward of and substantially against said lower rails and being slidably longitudinally thereon;

said connectors have upper and lower surface regions, wherein at least one of said upper surface regions forms an upper recess with a rearwardly-facing shoulder;

said upper sheet forms a tine with a free forward end lying in said upper recess and substantially against said rearwardly-facing shoulder.

* * * * *